(12) United States Patent
Kitamura et al.

(10) Patent No.: US 12,124,303 B2
(45) Date of Patent: Oct. 22, 2024

(54) ELECTRONIC APPARATUS

(71) Applicant: LENOVO (SINGAPORE) PTE. LTD., Singapore (SG)

(72) Inventors: Masahiro Kitamura, Yokohama (JP); Junki Hashiba, Yokohama (JP); Po Han Chen, Yokohama (JP); Satoshi Douzono, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 196 days.

(21) Appl. No.: 17/934,158

(22) Filed: Sep. 21, 2022

(65) Prior Publication Data
US 2023/0152867 A1    May 18, 2023

(30) Foreign Application Priority Data

Nov. 18, 2021 (JP) ................................ 2021-187825

(51) Int. Cl.
| | | |
|---|---|---|
| G06F 1/20 | (2006.01) | |
| G06F 1/16 | (2006.01) | |
| G06F 3/02 | (2006.01) | |
| H05K 7/20 | (2006.01) | |

(52) U.S. Cl.
CPC ............ *G06F 1/203* (2013.01); *G06F 1/1662* (2013.01); *G06F 3/0213* (2013.01); *H05K 7/20136* (2013.01)

(58) Field of Classification Search
CPC ...... G06F 1/203; G06F 1/1662; G06F 3/0213; H05K 7/20136
See application file for complete search history.

(56) References Cited

U.S. PATENT DOCUMENTS

| | | | |
|---|---|---|---|
| 10,871,809 B1* | 12/2020 | Horiuchi | ................ H01H 13/83 |
| 2018/0088637 A1* | 3/2018 | Uchino | ............... F28D 15/0275 |

FOREIGN PATENT DOCUMENTS

| | | | | |
|---|---|---|---|---|
| JP | 2012053611 A | | 3/2012 | |
| JP | 2013200677 A | * | 10/2013 | ........... G06F 1/1656 |
| JP | 6846547 B1 | | 3/2021 | |
| JP | 2021111099 A | | 8/2021 | |
| WO | 2016022145 A1 | | 2/2016 | |

OTHER PUBLICATIONS

English translation of JP 2013200677 A (Year: 2013).*

* cited by examiner

*Primary Examiner* — Mukundbhai G Patel
(74) *Attorney, Agent, or Firm* — SHIMOKAJI IP (57) ABSTRACT

An electronic apparatus includes a chassis, a keyboard device, a frame including partition walls, and a fan device. At least part of the partition walls has a bottom edge surface notched to form an air flow path between the notched bottom edge surface and a top surface of the plate-shaped member, to have a communicating path through which adjacent key arrangement holes communicate. A height of the communicating path in a region not overlapping with the fan device is lower than a height of the communicating path in a region overlapping with the fan device, in a plan view of the chassis.

8 Claims, 4 Drawing Sheets

ELECTRONIC APPARATUS

BACKGROUND OF THE INVENTION

Field of the Invention

The present invention relates to an electronic apparatus including a fan device.

Description of the Related Art

The present applicant has proposed an electronic apparatus, such as a laptop PC, in which a keyboard device at the top of a chassis has an opening for taking in outside air (see Japanese Patent No. 6846547).

SUMMARY OF THE INVENTION

The opening in Japanese Patent No. 6846547 includes a notch formed in a frame partitioning each key cap and a through hole formed in a plate-shaped member supporting each key cap. Both the notch and the through hole of this opening are provided only above a fan device. Such a structure has been found to be limited in improving cooling performance by increasing the air intake volume of the fan device. Meanwhile, the keyboard device is required to have high rigidity and strength because it is operated directly by a user. Simply increasing the installation range of the opening causes the keyboard device to decrease in rigidity and decrease in operability and texture.

A keyboard device mounted in an electronic apparatus such as a laptop PC easily conducts heat in a chassis, which is likely to cause user discomfort. In particular, in the keyboard device in Japanese Patent No. 6846547, each key cap is surrounded by the frame. In such a structure, there is little escape of heat transferred from inside the chassis to the keyboard device. This further worsens the problem of temperature rise.

A main object of the present invention is to provide an electronic apparatus that can improve cooling performance while suppressing decreases in operability and texture of a keyboard device. Another object of the present invention is to provide an electronic apparatus that can suppress temperature rise of a keyboard device located at the top of a chassis.

An electronic apparatus according to a first aspect of the present invention includes: a chassis; a keyboard device located at a top of the chassis, and including a plurality of key caps, a plate-shaped member that is located below the plurality of key caps and supports each of the plurality of key caps, and an opening formed through the plate-shaped member in a top-bottom direction; a frame supported on a top surface of the plate-shaped member, and including key arrangement holes in which the plurality of key caps are arranged and partition walls that surround the key arrangement holes to partition adjacent key caps from each other; and a fan device located in the chassis, and including an intake port on a top surface thereof, wherein at least part of the partition walls has a bottom edge surface notched to form an air flow path between the notched bottom edge surface and the top surface of the plate-shaped member, to have a communicating path through which adjacent key arrangement holes communicate, and wherein a height of the communicating path in a region not overlapping with the fan device is lower than a height of the communicating path in a region overlapping with the fan device, in a plan view of the chassis.

An electronic apparatus according to a second aspect of the present invention includes: a chassis; a keyboard device located at a top of the chassis, and including a plurality of key caps and a plate-shaped member that is located below the plurality of key caps and supports each of the plurality of key caps; and a frame supported on a top surface of the plate-shaped member, and including key arrangement holes in which the plurality of key caps are arranged and partition walls that surround the key arrangement holes to partition adjacent key caps from each other, wherein at least part of the partition walls has a bottom edge surface notched to form an air flow path between the notched bottom edge surface and the top surface of the plate-shaped member, to have a communicating path through which adjacent key arrangement holes communicate, and wherein the frame has at least a first region including a plurality of partition walls in which the communicating path has a first height, and a second region including a plurality of partition walls in which the communicating path has a second height lower than the first height.

An electronic apparatus according to a third aspect of the present invention includes: a chassis; a keyboard device located at a top of the chassis, and including a plurality of key caps and a plate-shaped member that is located below the plurality of key caps and supports each of the plurality of key caps; and a frame supported on a top surface of the plate-shaped member, and including key arrangement holes in which the plurality of key caps are arranged and partition walls that surround the key arrangement holes to partition adjacent key caps from each other, wherein at least part of the partition walls has a communicating path through which adjacent key arrangement holes communicate, and wherein the frame has at least a first region including a plurality of partition walls in which the communicating path has a first cross-sectional area, and a second region including a plurality of partition walls in which the communicating path has a second cross-sectional area smaller than the first cross-sectional area.

The above-described aspects of present invention can improve cooling performance while suppressing decreases in operability and texture of a keyboard device.

DETAILED DESCRIPTION OF THE INVENTION

Preferred embodiments of an electronic apparatus according to the present invention will be described in detail below, with reference to the accompanying drawings.

Figure 1:
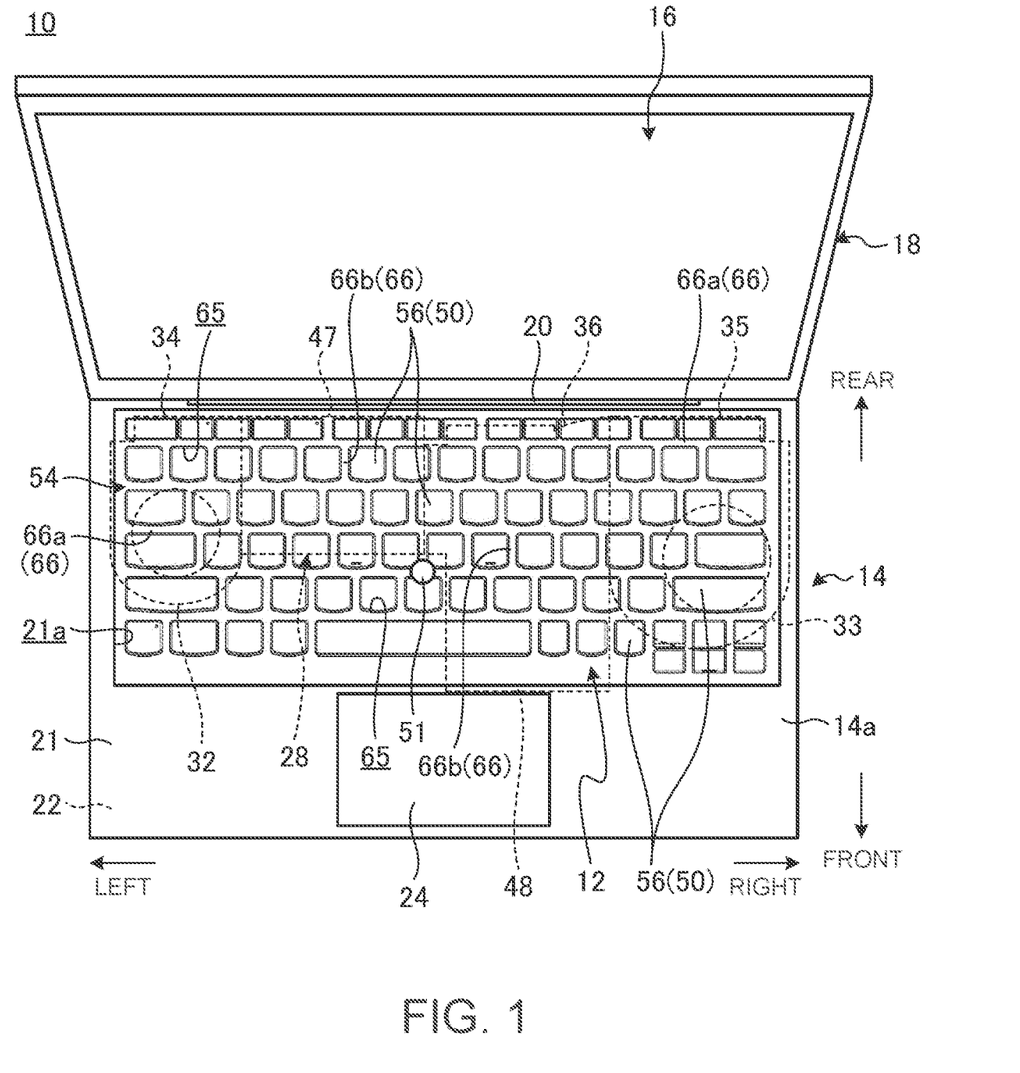
FIG. 1 is a schematic plan view of an electronic apparatus according to an embodiment as seen from above.

FIG. 1 is a schematic plan view of an electronic apparatus 10 according to an embodiment as seen from above. As illustrated in FIG. 1, the electronic apparatus 10 includes a chassis 14 in which a keyboard device 12 is mounted, and a display chassis 18 in which a display 16 is mounted. The electronic apparatus 10 is a clamshell laptop PC in which the chassis 14 and the display chassis 18 are relatively rotatably connected by a hinge 20. FIG. 1 illustrates a state in which the electronic apparatus 10 is in use form with the display chassis 18 being opened from the chassis 14. The electronic apparatus 10 may be an electronic apparatus other than clamshell type.

The display chassis 18 is a thin flat box body. The display chassis 18 has the display 16 mounted therein. The display 16 is, for example, an organic EL display or a liquid crystal display.

The chassis 14 and each element mounted in the chassis 14 will be described below. Hereafter, based on a posture of operating the keyboard device 12 illustrated in FIG. 1, the near side is referred to as "front", the far side as "rear", the width direction as "left-right direction", and the height direction (the thickness direction of the chassis 14) as "top-bottom direction".

Figure 2:
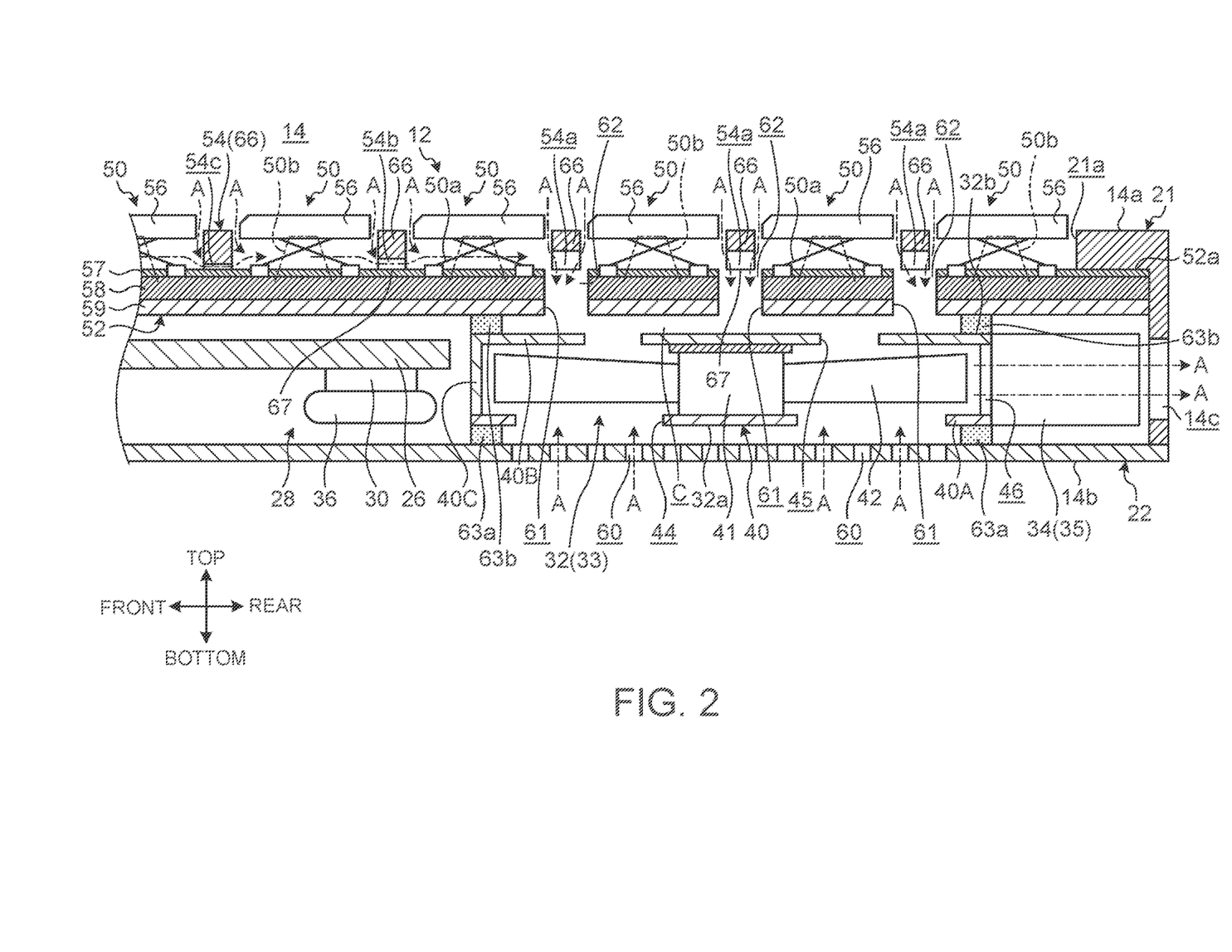
FIG. 2 is an enlarged side sectional view of essential parts schematically illustrating the internal structure of a chassis.

FIG. 2 is an enlarged side sectional view of essential parts schematically illustrating the internal structure of the chassis 14.

The chassis 14 is a thin flat box body. The chassis 14 includes a cover member 21 that forms a top surface 14a and four side surfaces, and a plate-shaped cover member 22 that forms a bottom surface 14b. The cover members 21 and 22 are overlapped in the thickness direction and detachably connected to each other. The rear edge of the chassis 14 is connected to the display chassis 18 using the hinge 20.

The cover member 21 at the top has an opening 21a into which the keyboard device 12 is inserted from below. The cover member 21 may have a shallow bathtub-like recessed portion instead of the opening 21a, and the keyboard device 12 may be placed on the bottom plate of the recessed portion from above. The cover members 21 and 22 are, for example, made of metal such as magnesium.

The keyboard device 12 and a touch pad 24 are provided on the top surface 14a of the chassis 14. The keyboard device 12 constitutes most of the top surface 14a. A board 26 and a cooling module 28 are housed inside the chassis 14. Various electronic components such as a battery device, mechanical components, and the like are also provided inside the chassis 14.

The board 26 is a motherboard of the electronic apparatus 10. The board 26 is a printed board on which a central processing unit (CPU) 30 is mounted. Various electronic components such as a graphics processing unit (GPU), a communication module, memory, and connection terminals are also mounted on the board 26. The board 26 is located below the keyboard device 12. The board 26 is screwed to the back surface of the keyboard device 12 and the inner surface of the cover member 21, and thus is fixed to the chassis 14. The board 26 has a top surface that serves as a mounting surface for the cover member 21, and a bottom surface that serves as a mounting surface for the CPU 30 and the like.

The CPU 30 is a processing device that performs operations related to main control and processing of the electronic apparatus 10. The CPU 30 is the largest heating element among the devices mounted in the electronic apparatus 10.

The cooling module 28 is a device that absorbs heat mainly generated by the CPU 30, transports the absorbed heat, and discharges it to the outside of the chassis 14. The cooling module 28 can also discharge the heat of heating elements other than the CPU 30, such as the GPU, to the outside of the chassis 14. Most of the cooling module 28 is located below the board 26. The cooling module 28 is screwed to the bottom surface of the board 26, the back surface of the keyboard device 12, the inner surface of the cover member 21, and the like, and thus is fixed to the chassis 14.

The cooling module 28 includes fan devices 32 and 33, cooling fins 34 and 35, and a heat pipe 36.

The cooling module 28 in this embodiment is used for cooling the CPU 30 and the GPU, and accordingly includes one pair of fan devices and one pair of cooling fins. Depending on the object to be cooled, the required capacity, etc., the cooling module 28 may include one fan device and one cooling fin. The fan devices 32 and 33 have the same or similar basic structure, except that they are slightly different in size and shape. The cooling fins 34 and 35 have the same or similar basic structure, except that they are slightly different in size and shape. Hence, the fan device 32 and the cooling fins 34 will be described below as representative examples, while omitting the description of the fan device 33 and the cooling fin 35.

The fan devices 32 and 33 are respectively arranged near the left and right rear corners of the chassis 14 (see FIG. 1). As illustrated in FIG. 2, the fan device 32 includes a fan chassis 40, a rotating part 41, and an impeller 42. The fan device 32 is a centrifugal fan in which the rotating part 41 rotates by a motor to cause the impeller 42 located on the outer peripheral side of the rotating part 41 to rotate.

The fan chassis 40 is a flat box body that houses the rotating part 41 and the impeller 42. The fan chassis 40 has a bottom plate 40A, a top plate 40B, and a side plate 40C. The plates 40A to 40C are, for example, metal plates.

The bottom plate 40A is an approximately bullet-shaped thin plate obtained by forming one side of a rectangular plate into a circular shape. The bottom plate 40A forms the bottom surface 32a of the fan device 32. The bottom plate 40A has a bottom intake port 44. The bottom intake port 44 is a through hole in, for example, a circular shape, a donut shape, or a shape in which a plurality of ellipses are arranged in the circumferential direction.

The top plate 40B is a thin plate having the same outer shape as the bottom plate 40A. The top plate 40B forms the top surface 32b of the fan device 32. The top plate 40B has a top intake port 45. The top intake port 45 may have the same or similar shape as the bottom intake port 44. The intake ports 44 and 45 are openings for taking in air outside the fan chassis 40 by the rotation of the impeller 42.

The side plate 40C is a curved plate that covers the sides of the inside space of the fan chassis 40 formed between the bottom plate 40A and the top plate 40B. The side plate 40C in this embodiment is formed integrally with the top plate 40B. The side surface of the fan chassis 40 facing the rear has an opening as a result of the side plate 40C not being present or the side plate 40C having a hole. This opening serves as the exhaust port 46 of the fan device 32. The exhaust port 46 faces the cooling fin 34.

The front surfaces of the cooling fins 34 and 35 are located just behind the fan devices 32 and 33 respectively, and each face the corresponding exhaust port 46. The rear surfaces of the cooling fins 34 and 35 each face the corresponding chassis exhaust port 14c that opens on the rear side surface of the chassis 14. The cooling fin 34 has a structure in which a plurality of plate-shaped metal fins are arranged at equal intervals in the left-right direction on the surface of a plate. Each fin stands in the top-bottom direction, and extends in the front-rear direction. A gap through which the air sent from the fan device 32 passes is formed between adjacent fins. The cooling fin 34 is thermally connected to the CPU 30 via the heat pipe 36.

The heat pipe 36 is a pipe-shaped heat transport device. One heat pipe 36 or a set of two or more heat pipes 36 is used. The heat pipe 36 is formed by crushing a metal pipe into a thin flat shape to form an elliptical cross-section and enclosing a working fluid in the inside sealed space. The heat pipe 36 may be a known heat pipe. The heat pipe 36 has, for example, a heat absorbing portion at one end thermally connected to the CPU 30 and a heat radiating portion at the other end connected to the cooling fins 34 and 35.

In the cooling module 28, the heat of the CPU 30 and the like carried by the heat pipe 36 is transferred to the cooling fins 34 and 35. The heat transferred to the cooling fins 34 and 35 is discharged to the outside of the chassis 14 through the chassis exhaust port 14c, by blast air from the exhaust ports 46 of the fan devices 32 and 33. Reference symbols 47 and 48 in FIG. 1 are plate-shaped heat transport devices for diffusing the heat of the CPU 30 and the like, and are, for example, metal plates or vapor chambers.

As illustrated in FIGS. 1 and 2, the keyboard device 12 includes a plurality of key switches 50, a plate-shaped member 52, and a frame 54.

Each key switch 50 is supported on the top surface 52a side of the plate-shaped member 52. Each key switch 50 has a key cap 56 supported by a guide mechanism 50a and a rubber dome 50b so as to be movable in the top-bottom direction. The guide mechanism 50a is a scissor mechanism that connects the bottom surface of the key cap 56 and the top surface of the plate-shaped member 52. The rubber dome 50b is a dome-shaped member made of a flexible elastic material such as silicone rubber. The rubber dome 50b is located at the center of the guide mechanism 50a, and is interposed between the key cap 56 and the plate-shaped member 52. Each keycap 56 is made of resin as an example, and has an approximately rectangular shape in a plan view. Each keycap 56 has side walls hanging down from four peripheral edges of a top plate forming an operation surface.

As illustrated in FIG. 1, a pointing stick 51 is provided approximately at the center of the keyboard device 12. The pointing stick 51 is an operation device that substitutes for a mouse.

The plate-shaped member 52 is formed by laminating a membrane sheet 57, a base plate 58, and a light guide plate 59 in this order from top to bottom. The membrane sheet 57 is, for example, a switch sheet with a three-layer structure that closes a contact when pressed. The contact of the membrane sheet 57 is closed by the rubber dome 50b that is compressed when the keycap 56 is pressed down. The base plate 58 is a metal plate having cut-and-raised portions and holes formed at various locations. The light guide plate 59 is a transparent resin plate that guides the light emitted by a light source attached to the bottom surface in the left-right direction, reflects the light on the light reflection surface, and irradiates each keycap 56 from the back surface. The light guide plate 59 may be omitted. In such a case, a waterproof sheet may be laminated on the bottom surface of the base plate 58.

The frame 54 is a mesh plate made of resin, metal, or the like. The frame 54 partitions each keycap 56. The frame 54 has a plurality of key arrangement holes 65 in which the key caps 56 are arranged so as to be movable in the top-bottom direction. That is, the frame 54 has partition walls 66 that partition adjacent key caps 56, and each space surrounded by the partition walls 66 on all four sides is the key arrangement hole 65.

The frame 54 is fixed as a result of the bottom edge surface 67 of each partition wall 66 being supported by the top surface 52a of the plate-shaped member 52. In this embodiment, the frame 54 is formed integrally with the cover member 21 (see FIG. 4). The frame 54 may be formed separately from the cover member 21. In this case, the frame 54 is fixed to the plate-shaped member 52 and substantially forms part of the keyboard device 12.

As illustrated in FIG. 2, the chassis 14 has a bottom communicating hole 60 for allowing air A to flow to the inside from the bottom surface 14b. Dashed-dotted arrow A in FIG. 2 schematically indicates the flow of air.

The bottom communicating hole 60 is a through hole formed in the cover member 22 forming the bottom surface 14b of the chassis 14. The bottom communicating hole 60 has, for example, a structure in which a plurality of slit-like holes are arranged side by side. The bottom communicating hole 60 is provided at a position overlapping with the bottom intake port 44 of each of the fan devices 32 and 33 in a plan view, and faces the bottom intake port 44.

As illustrated in FIG. 2, the chassis 14 has a top communicating hole 62 for allowing air A to flow to the inside from above.

The top communicating hole 62 is a through hole formed through the keyboard device 12 in the top-bottom direction, and communicates with the top intake port 45 of each of the fan devices 32 and 33. The top communicating hole 62 is formed as a result of the gap between the adjacent key cap 56 and partition wall 66, each of communicating paths 54a to 54c, and an opening 61 communicating in this order from top to bottom. The communicating paths 54a to 54c are each formed by notching the bottom edge surface 67 of the partition wall 66 to form the flow path of air A. The communicating paths 54a to 54c will be described in detail later. The openings 61 are each a through hole formed in the plate-shaped member 52. For example, the openings 61 are a plurality of rectangular long holes located below lateral wall portions 66a of the frame 54 along the left-right direction and extending in the left-right direction. The shape of each opening 61 may be the same as or similar to that of the top intake port 45.

Thus, as illustrated in FIG. 2, each of the fan devices 32 and 33 draws air A below the chassis 14 from the bottom communicating hole 60 of the cover member 22 through the bottom intake port 44. Simultaneously, each of the fan devices 32 and 33 draws air A above the chassis 14 from the top communicating hole 62 through the top intake port 45. Each of the fan devices 32 and 33 air-cools the corresponding one of the cooling fins 34 and 35 when the air A sucked from the intake ports 44 and 45 is discharged from the exhaust port 46 to the outside of the chassis 14. Hence, the fan devices 32 and 33 can sufficiently take in air from the top and bottom of the chassis 14, with it being possible to achieve high cooling efficiency.

Reference symbols 63a and 63b in FIG. 2 are sealing materials made of sponge or the like. The sealing material 63a forms a cutoff wall around the bottom intake port 44. The sealing material 63b forms a cutoff wall around the top intake port 45. When a liquid such as beverage is spilled on the keyboard device 12, the sealing members 63a and 63b prevent the liquid from entering the board 26 and the like in the chassis 14.

Figure 3:
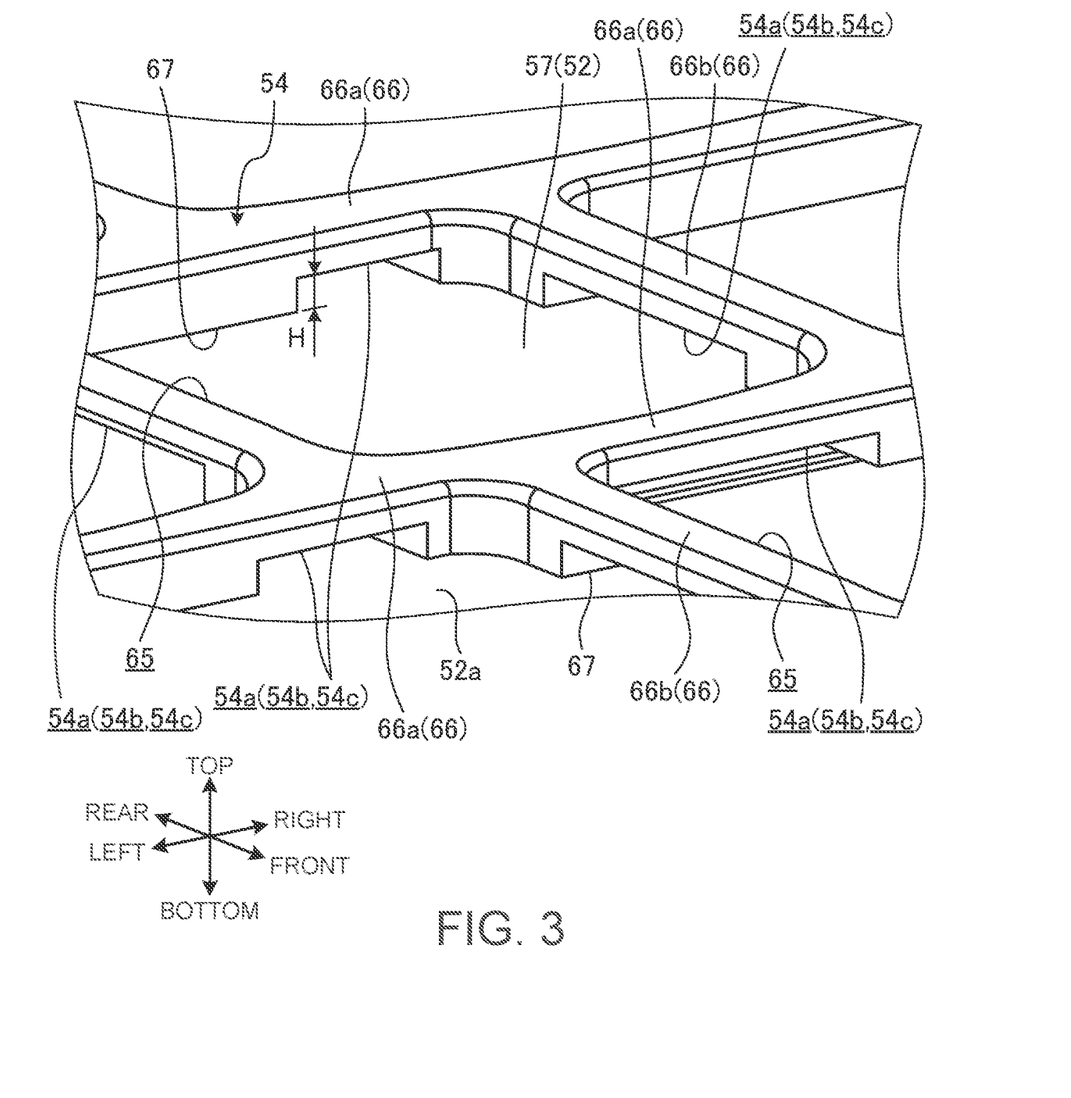
FIG. 3 is an enlarged perspective view of part of a frame as seen obliquely from above.
Figure 4:
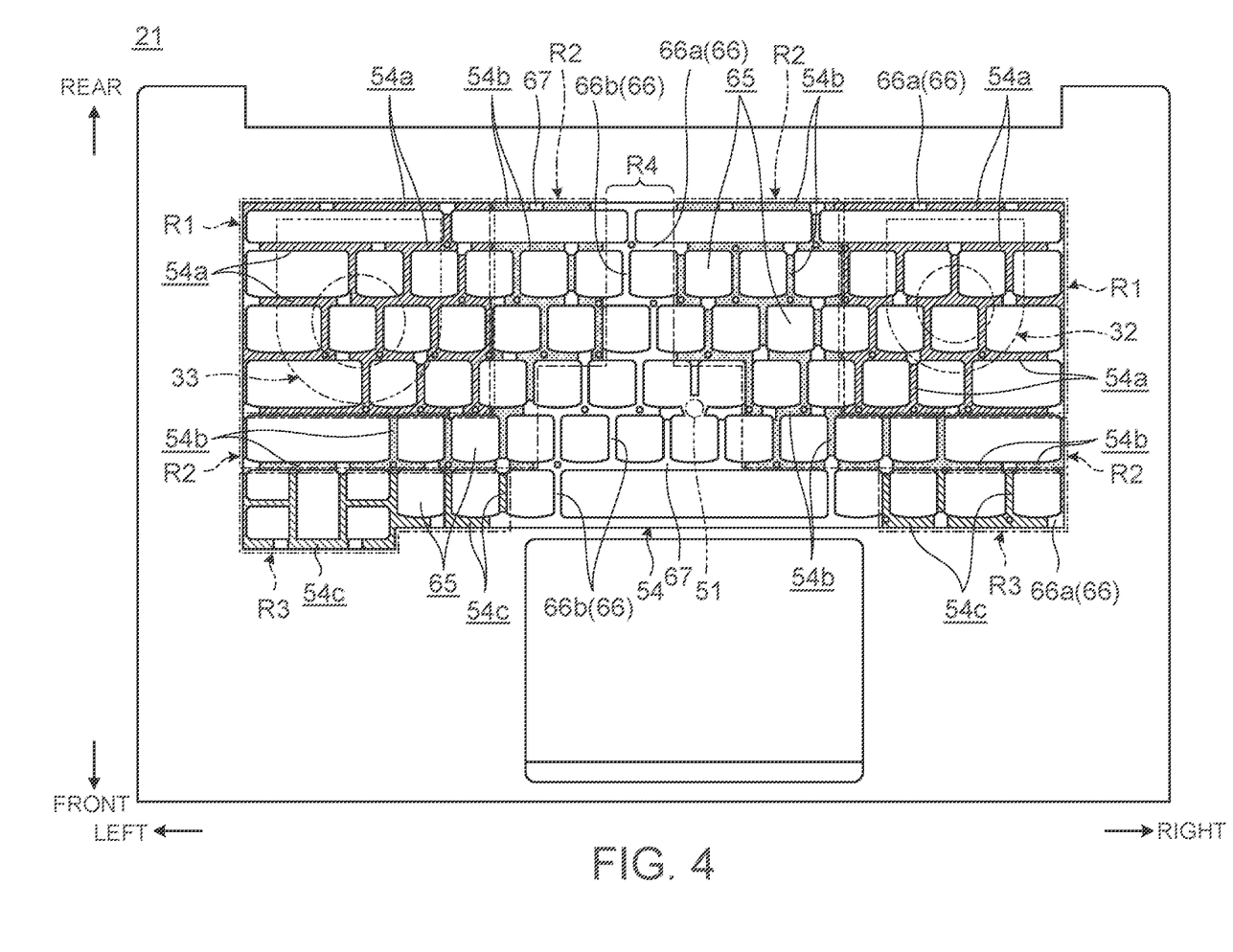
FIG. 4 is a bottom view of a cover member 21 formed integrally with the frame.

The specific structure of the communicating paths 54a to 54c formed in the frame 54 will be described below. FIG. 3 is an enlarged perspective view of part of the frame 54 as seen obliquely from above. FIG. 4 is a bottom view of the cover member 21 formed integrally with the frame 54.

In FIG. 4, the communicating path 54a is indicated by a slant line pattern inclined in the direction of approximately 2 o'clock (8 o'clock) in clock position. The communicating path 54b is indicated by a dot pattern. The communicating path 54c is indicated by a slant line pattern inclined in the direction of approximately 10 o'clock (4 o'clock) in clock position.

As illustrated in FIGS. 2 and 3, the communicating paths 54a to 54c communicate between the key placement holes 65 partitioned by the partition wall 66 to allow air A to move. The bottom edge surface 67 of the frame 54 is supported by the top surface 52a of the plate-shaped member 52. The communicating paths 54a to 54c are recessed portions formed by cutting the frame 54 upward from the bottom edge surface 67 side. The communicating paths 54a to 54c thus serve as tunnels that communicate between adjacent key arrangement holes 65. The communicating paths 54a to 54c may be formed during molding of the frame 54, or formed by machining or the like after the molding of the frame 54.

The partition wall 66 of the frame 54 has a lateral wall portion 66a extending in the left-right direction of the keyboard device 12 and a longitudinal wall portion 66b extending in the front-rear direction of the keyboard device 12. The communicating paths 54a to 54c in this embodiment are formed in both the lateral wall portion 66a and the longitudinal wall portion 66b (see FIGS. 3 and 4). The communicating paths 54a to 54c may be formed in only one of the lateral wall portion 66a and the longitudinal wall portion 66b.

As illustrated in FIG. 4, the communicating path 54a is provided in a first region R1 including the position overlapping with each of the left and right fan devices 32 and 33 and its periphery in a plan view of the cover member 21, i.e., a plan view of the chassis 14. The communicating path 54b is provided in a second region R2 surrounding the first region R1. The communicating path 54c is provided in a third region R3 surrounding the second region R2. In this embodiment, the communicating paths 54b and 54c are located so as not to overlap with the left and right fan devices 32 and 33.

In the structural example illustrated in FIG. 4, the fan devices 32 and 33 are arranged at the left and right rear corners of the frame 54. Accordingly, the second region R2 has an approximately L shape so as to surround not the entire periphery but approximately two sides of the first region R1. The third region R3 has an approximately linear shape so as to surround not the entire periphery but approximately one side of the second region R2. The second region R2 may surround one side or three or more sides of the first region R1. The third region R3 may surround two or more sides of the second region R2.

Thus, the communicating paths 54a to 54c are provided in most of the frame 54, and the regions R1 to R3 are arranged in order and are continuous. In this way, the communicating paths 54a to 54c form air flow paths that communicate between all of the plurality of key arrangement holes 65 in the regions R1 to R3, on the top surface 52a of the plate-shaped member 52.

Specifically, as illustrated in FIG. 4, the communicating paths 54a to 54c form an air flow path that continues from the third region R3 through the second region R2 to the first region R1. In this embodiment, a pair of left and right air flow paths are provided so as to correspond to the left and right fan devices 32 and 33.

A fourth region R4 is formed at the center between the left regions R1 to R3 and the right regions R1 to R3. The fourth region R4 extends in the front-rear direction at approximately the center of the frame 54. The partition wall 66 located in the fourth region R4 does not have the communicating paths 54a to 54c. That is, the fourth region R4 is a shielding wall that partitions the air flow paths in the left regions R1 to R3 corresponding to the left fan device 32 and the air flow paths in the right regions R1 to R3 corresponding to the right fan device 33.

The fourth region R4 in this embodiment has, for example, a stepped mountain shape in a plan view in FIG. 4. Thus, the fourth region R4 extends to a range including the pointing stick 51 while forming a shielding wall between the left regions R1 to R3 and the right regions R1 to R3. The fourth region R4 may be omitted, and all of the partition walls 66 may be provided with the communicating paths 54a to 54c.

As illustrated in FIG. 3, the height of each of the communicating paths 54a to 54c is denoted by H. The height H substantially refers to the height from the top surface 52a of the plate-shaped member 52 to the ceiling of the corresponding one of the communicating paths 54a to 54c. That is, the height H indicates the height of the air flow path formed by the corresponding one of the communicating paths 54a to 54c. As illustrated in FIG. 2, the heights H of the communicating paths 54a to 54c are different. Hereafter, the height H of the communicating path 54a is referred to as a first height, the height H of the communicating path 54b as a second height, and the height H of the communicating path 54c as a third height.

In this embodiment, the first height of the communicating path 54a is highest, the third height of the communicating path 54c is lowest, and the second height of the communicating path 54b is an intermediate height between the first height and the third height. In this embodiment, the first height is set to 0.5 mm, the second height to 0.3 mm, and the third height to 0.1 mm. Therefore, the communicating paths 54a to 54c are arranged stepwise so that the height H gradually decreases in the direction away from the first region R1 overlapping with each of the fan devices 32 and 33 (see FIGS. 2 and 5).

As described above, in the electronic apparatus 10 in this embodiment, at least part of the partition walls 66 has the communicating paths 54a to 54c. The height H of each of the communicating paths 54b and 54c in the regions R2 and R3 that do not overlap with the fan devices 32 and 33 is lower than the height H of the communicating path 54a in the first region R1 that overlaps with the fan devices 32 and 33.

Thus, in the electronic apparatus 10, not only the communicating path 54a is provided in the first region R1 that overlaps with the fan devices 32 and 33 but also the communicating paths 54b and 54c are provided in the partition walls 66 in the regions R2 and R3 that do not overlaps with the fan devices 32 and 33. Therefore, as illustrated in FIG. 2, each of the fan devices 32 and 33 can draw air from a wide range including not only the communicating path 54a located directly above but also the other communicating paths 54b and 54c. In such electronic apparatus 10, the air volume of the fan devices 32 and 33 increases, and the cooling performance of the cooling module 28 is improved.

The height H of each of the communicating paths 54b and 54c in the regions R2 and R3 that do not overlap with the fan devices 32 and 33 is lower than the height H of the communicating path 54a in the first region R1 that overlaps with the fan devices 32 and 33. Therefore, despite the communicating paths 54a to 54c being formed in a wide range of partition walls 66, the decrease in strength and rigidity of the frame 54 as a whole is minimum. Consequently, the electronic apparatus 10 can suppress decreases in operability and texture of the keyboard device 12. This is because the communicating paths 54b and 54c lower in height H have less influence on the decrease in rigidity of the frame 54 than the communicating path 54*a* higher in height H.

Moreover, in the electronic apparatus 10, the height H of the communicating path 54*a* in the first region R1 that overlaps with each of the fan devices 32 and 33 is highest, so that the decrease in the amount of intake air from the top intake port 45 due to the communicating path 54*a* as a bottleneck can be prevented.

For the electronic apparatus 10 in this embodiment including the communicating paths 54*a* to 54*c* and an electronic apparatus of a comparative example including the communicating path 54*a* only directly above each of the fan devices 32 and 33, an experiment of measuring the surface temperature of the keyboard device 12 and an experiment of comparing the fan air volume by visually observing the amount of smoke sucked in were conducted. As a result, in the surface temperature measurement experiment, in the electronic apparatus 10 in this embodiment, the temperature of the entire top surface 14*a* of the chassis 14 was lower than in the comparative example, and the temperature of a part directly above each of the fan devices 32 and 33 that tends to be high in temperature, such as a part directly above each of the fan devices 32 and 33, was lower than in the comparative example. In the experiment of comparing the air volume of the fan devices 32 and 33, in the electronic apparatus 10 in this embodiment, the amount of sucked smoke was greater and the fan air volume was greater than in the comparative example.

The partition wall 66 has the lateral wall portion 66*a* extending in the left-right direction and the longitudinal wall portion 66*b* extending in the front-rear direction. The communicating paths 54*a* to 54*c* are formed in both the lateral wall portion 66*a* and the longitudinal wall portion 66*b*. Therefore, as illustrated in FIGS. 2 and 4, in the electronic apparatus 10, air A smoothly flows toward the communicating path 54*a* through the other communicating paths 54*b* and 54*c*. Hence, in the electronic apparatus 10, the air volume of the fan devices 32 and 33 can be further increased and the cooling performance can be further improved. Meanwhile, forming the communicating paths 54*a* to 54*c* in the lateral wall portion 66*a* and the longitudinal wall portion 66*b* in this way is likely to cause a decrease in the rigidity of the frame 54. Such decrease in the rigidity of the frame 54 can, however, be minimized by making the heights H of the communicating paths 54*a* to 54*c* different in the electronic apparatus 10.

The number of types of communicating paths that differ in height may be other than three, for example, may be two, or four or more. For example, consider the case where the number of types of communicating paths that differ in height is two and the communicating path 54*c* is omitted. In this case, for example, the communicating path 54*b* needs to be provided over a wide range including the regions R2 and R3 in order to ensure the air flow rate, which may cause a decrease in the rigidity of the frame 54. It is therefore preferable that there are the three different communicating path heights illustrated in FIG. 4 or four or more different communicating path heights and such communicating paths are arranged stepwise, from the viewpoint of the rigidity of the frame 54 and smooth air circulation in the frame 54. Even in a structure in which the number of types of communicating paths that differ in height is two, the rigidity of the frame 54 can be maintained higher than in the case where the number of types of communicating paths that differ in height is one. A structure in which the number of types of communicating paths that differ in height is two is therefore sufficiently effective depending on conditions such as the material and size of the frame 54.

The above describes an example in which the communicating paths 54*a* to 54*c* are formed as notch-shaped recessed portions and made different in height H to achieve both improving the cooling performance of the cooling module 28 and ensuring the rigidity of the frame 54. Alternatively, the communicating paths 54*a* to 54*c* may be formed, for example, by making part of the partition walls 66 thinner in the top-bottom direction, or formed as through holes in the partition walls 66. The electronic apparatus 10 may achieve both improving the cooling performance of the cooling module 28 and ensuring the rigidity of the frame 54, by forming the communicating paths 54*a* to 54*c* by thinning part of the partition walls 66 or forming through holes in the partition walls 66 and also making the communicating paths 54*a* to 54*c* different in cross-sectional area (flow path cross-sectional area). In this case, the electronic apparatus 10 may be configured so that the cross-sectional area (second cross-sectional area) of the communicating path 54*b* in the second region R2 is smaller than the cross-sectional area (first cross-sectional area) of the communicating path 54*a* in the first region R1 and the cross-sectional area (third cross-sectional area) of the communicating path 54*c* in the third region R3 is smaller than the second cross-sectional area.

The electronic apparatus 10 includes the pair of left and right fan devices 32 and 33. The frame 54 has the fourth region R4 in which the communicating path 54*a* and the like are not formed in the partition wall 66 between the pair of fan devices 32 and 33 in a plan view of the chassis 14. That is, in the electronic apparatus 10, the intake range of the left fan device 32 and the intake range of the right fan device 33 are separated by the fourth region R4 serving as a shielding wall. The electronic apparatus 10 can thus prevent unbalanced air circulation, such as the air intake amount of the fan device 32 decreasing significantly, caused by an overlap of the air intake ranges of the left and right fan devices 32 and 33. As a result, the cooling performance in the electronic apparatus 10 can be further stabilized and improved.

The fourth region R4 in this embodiment includes the installation region of the pointing stick 51. Since the pointing stick 51 is operated while being pressed by the user, the pointing stick 51 is required to have even higher rigidity than each keycap 56. In the electronic apparatus 10, no communicating path is provided in the partition wall 66 around the installation position of the pointing stick 51 (see FIG. 4), so that the decrease in the mounting rigidity of the pointing stick 51 can be prevented.

In the electronic apparatus 10, as a result of the communicating paths 54*a* to 54*c* being provided in a wide range of the frame 54, the heat transferred from the CPU 30 and the like to the plate-shaped member 52 can be dissipated by the flow of air A passing through the communicating paths 54*a* to 54*c*. Accordingly, in the electronic apparatus 10, the top communicating hole 62 formed through the keyboard device 12 is not essential. That is, even if the electronic apparatus 10 does not have the top communicating hole 62, the outside air can easily flow over a wide area of the top surface 52*a* of the plate-shaped member 52 through the communicating paths 54*a* to 54*c*, and the temperature rise of the keyboard device 12 can be prevented. In this case, it is desirable that as many communicating paths 54*a* to 54*c* as possible are provided. Preferably, the communicating paths 54*a* to 54*c* are provided in all partition walls 66.

The present invention is not limited to the above-described embodiments, changes can be freely made without departing from the gist of the present invention.

The invention claimed is:

1. An electronic apparatus comprising:
a chassis;
a keyboard device at a top of the chassis, and including a plurality of key caps, a plate-shaped member that is below the plurality of key caps and supports each of the plurality of key caps, and an opening formed through the plate-shaped member in a top-bottom direction;
a frame supported on a top surface of the plate-shaped member, and including key arrangement holes in which the plurality of key caps are arranged and including partition walls that surround the key arrangement holes to partition adjacent key caps from each other; and
a fan device in the chassis, and including an intake port on a top surface of the fan device,
wherein at least part of the partition walls has a bottom edge surface notched to form an air flow path between the notched bottom edge surface and the top surface of the plate-shaped member, and to thereby form a communicating path through which adjacent key arrangement holes communicate, and
wherein a cross-sectional height of the notched bottom edge surface of the communicating path in a region not overlapping with the fan device is less than a cross-sectional height of the notched bottom edge surface of the communicating path in a region overlapping with the fan device.

2. The electronic apparatus according to claim 1, further comprising a plurality of communicating paths, wherein a number of types of communicating paths that differ in cross-sectional height at the notched bottom edge surface is three or more, and
wherein the plurality of communicating paths is arranged stepwise so as to decrease in cross-sectional height of the notched bottom edge surface in a direction away from the region overlapping with the fan device.

3. The electronic apparatus according to claim 1, wherein the fan device comprises a pair of fan devices, and
wherein the frame has a region in which there is an absence of the communicating path in a partition wall between the pair of fan devices.

4. An electronic apparatus comprising:
a chassis;
a keyboard device at a top of the chassis, and including a plurality of key caps, and a plate-shaped member that is below the plurality of key caps and that supports each of the plurality of key caps; and
a frame supported on a top surface of the plate-shaped member, and including key arrangement holes in which the plurality of key caps are arranged, and including partition walls that surround the key arrangement holes to partition adjacent key caps from each other,
wherein at least part of the partition walls has a bottom edge surface notched to form an air flow path between the notched bottom edge surface and the top surface of the plate-shaped member, and to form a communicating path through which adjacent key arrangement holes communicate, and
wherein the frame has at least a first region including a plurality of partition walls in which the communicating path has a first cross-sectional height of the notched bottom edge surface, and a second region including another plurality of partition walls in which the communicating path has a second cross-sectional height of the notched bottom edge surface less than the first height.

5. The electronic apparatus according to claim 4, wherein the frame further has a third region including a further plurality of partition walls in which the communicating path has a third cross-sectional height of the notched bottom edge surface less than the second cross-sectional height of the notched bottom edge surface, and
wherein the first region, the second region, and the third region are arranged in the foregoing listed order.

6. An electronic apparatus comprising:
a chassis;
a keyboard device at a top of the chassis, and including a plurality of key caps, and a plate-shaped member that is below the plurality of key caps and that supports each of the plurality of key caps; and
a frame supported on a top surface of the plate-shaped member, and including key arrangement holes in which the plurality of key caps are arranged, and including partition walls that surround the key arrangement holes to partition adjacent key caps from each other,
wherein at least part of the partition walls has a communicating path through which adjacent key arrangement holes communicate, and
wherein the frame has at least a first region including a plurality of partition walls in which the communicating path has a notch with a first cross-sectional area, and a second region including another plurality of partition walls in which the communicating path has another notch with a second cross-sectional area smaller than the first cross-sectional area.

7. The electronic apparatus according to claim 6, further comprising
a fan device in the chassis, and including an intake port on a top surface of the fan device,
wherein the keyboard device further includes an opening formed through the plate-shaped member in a top-bottom direction, and
wherein the first region overlaps with the fan device and the second region does not overlap with the fan device.

8. The electronic apparatus according to claim 7, wherein at least one partition wall includes a lateral wall portion extending in a left-right direction of the keyboard device and a longitudinal wall portion extending in a front-rear direction of the keyboard device, and
wherein the communicating path is formed in both the lateral wall portion and the longitudinal wall portion.

* * * * *